United States Patent
Iijima

(10) Patent No.: US 6,324,099 B1
(45) Date of Patent: Nov. 27, 2001

(54) 2-BIT/CELL TYPE NONVOLATILE SEMICONDUCTOR MEMORY

(75) Inventor: Mitsuteru Iijima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/721,656

(22) Filed: Nov. 27, 2000

(30) Foreign Application Priority Data

Nov. 25, 1999 (JP) .................................................. 11-334916

(51) Int. Cl.$^7$ .................................................. G11C 16/04
(52) U.S. Cl. .............................. 365/185.24; 365/185.28; 365/185.26; 365/185.01; 365/182
(58) Field of Search .................... 365/185.24, 185.28, 365/185.26, 185.01, 182, 184, 185.27, 185.29

(56) References Cited

U.S. PATENT DOCUMENTS 5,768,192   6/1998   Eitan .
6,031,763 * 2/2000   Sansbury .......................... 365/185.24

FOREIGN PATENT DOCUMENTS 5-326884   12/1993 (JP) .

* cited by examiner

Primary Examiner—David Nelms
Assistant Examiner—David Lam

(74) Attorney, Agent, or Firm—Arent Fox Kintner Plotkin & Kahn, PLLC

(57) ABSTRACT

A control method for a nonvolatile semiconductor memory having a number of nonvolatile semiconductor memory cells formed on a surface of a semiconductor substrate each having a gate insulating film including a carrier trap layer, a gate electrode formed on the gate insulating film, and first and second diffusion regions symmetrically formed in the semiconductor substrate on both sides of the gate electrode. The control method includes the steps of: selectively writing data at a memory position near the first or second diffusion region through injection of hot charge carriers of a first conductivity type, by applying a first high level voltage to the first or second diffusion region, a second voltage lower than the first voltage to the second or first diffusion region, and a third voltage higher than the second voltage to the gate electrode; and selectively erasing the data at the memory position near the first or second diffusion region through injection of hot charge carriers of a second conductivity type opposite to the first conductivity type generated by an interband tunneling effect, by applying a first high level voltage to the first or second diffusion region, a second voltage lower than the first voltage to the second or first diffusion region, and a third voltage lower than the first voltage or of an opposite polarity to the gate electrode. The nonvolatile semiconductor memory can store a plurality of data per one cell, is easy to be manufactured and has high reliability.

9 Claims, 6 Drawing Sheets

2-BIT/CELL TYPE NONVOLATILE SEMICONDUCTOR MEMORY

This application is based on Japanese Patent Application hei 11-334916, filed on Nov. 25, 1999, the entire contents of which are incorporated herein by reference.

BACKGROUND OF THE INVENTION a) Field of the Invention

The present invention relates to a nonvolatile semiconductor memory and its control method, the memory storing data by capturing electric charges in an insulating film having a carrier trap layer.

b) Description of the Related Art

An insulated gate type field effect transistor has an insulated gate electrode on a gate insulating film formed on the surface of a channel region in a semiconductor substrate and a pair of source/drain regions formed in the semiconductor substrate on both sides of the gate electrode. An on/off state of the insulated gate type field effect transistor is determined by a voltage of the gate electrode relative to one of the source/drain regions.

A nonvolatile memory capable of changing its on/off state at the same gate voltage with a presence/absence of charge carriers in the gate insulating film can be realized by providing the gate insulating film with the structure capable of storing charge carriers. The charge carrier storage structure can be formed by a floating gate electrode and a silicon nitride film and the like. A dielectric carrier trap structure having a silicon nitride film sandwiched between silicon oxide films is known as an oxide-nitride-oxide (ONO) film.

A known method of writing/erasing charges in the nitride film of an ONO film is to apply a sufficiently high voltage across the gate electrode and channel region and to let charge carriers tunnel from the channel region into the nitride film, or in a reverse direction from the nitride film into the channel region.

A nonvolatile semiconductor memory having a p-type channel region, n-type source/drain regions, a gate insulating film with a carrier storage function, and a gate electrode on the gate insulating film will be described, the memory of this type being used only for illustrative purposes.

JP-B-5-326884 proposes a semiconductor memory. According to this memory, a p-type pocket layer surrounding an n-type drain region is formed. In writing data, hot electrons are injected into the nitride film by applying a high voltage (about 7 V) to the drain region and a write voltage to the gate electrode. In erasing data, an erase programming voltage is applied to the drain region to produce an interband tunneling effect near at the boundary between the drain region and pocket layer and inject some of hot holes into the nitride film.

U.S. Pat. No. 5,768,192 proposes a method of selectively injecting hot electrons either in one region or in the other region of a nitride film by flowing programming current between one (first region) of the source/drain regions and the other (second region) either in one direction or in the opposite direction.

If electrons are flowed from the first region to the second region, these electrons become hot electrons and injected into the nitride film near the second region. If electrons are flowed from the second region to the first region, these electrons become hot electrons and injected into the nitride film near the first region.

In the read process, read electron current flowed from the second region to the first region is influenced greatly by stored charges near at the second region but is influenced less by stored charges near at the first region. Read electron current flowed from the first region to the second region is influenced greatly by stored charges near at the first region but is influenced less by stored charges near at the second region.

Nonvolatile memories of a 2-bit/1-cell type have been proposed as described above. A memory cell of a 2-bit/1-cell type having the structure similar to a conventional memory cell can provide a twofold memory capacity.

U.S. Pat. No. 768,192 does not teach the erase method although it discloses the programming and the read method.

SUMMARY OF THE INVENTION

It is an object of the present invention to provide a nonvolatile semiconductor memory capable of storing a plurality of data per one cell, being manufactured with ease and having high reliability.

It is another object of the invention to provide a novel control method for a nonvolatile semiconductor memory capable of storing a plurality of data per one cell.

According to one aspect of the present invention, there is provided a nonvolatile semiconductor memory comprising: a semiconductor substrate of a first conductivity type; first and second diffusion regions of a second conductivity type symmetrically formed in a surface layer of the semiconductor substrate to define a channel region therebetween; a gate insulating film formed on the channel region, the gate insulating film including a carrier trap layer capable of trapping charge carriers; a gate electrode formed on the gate insulating film; and a control circuit for controlling: in a data write mode, to apply a high level voltage to the gate electrode, a low level voltage to one of the first and second diffusion regions, and a high level voltage to the other of the first and second diffusion regions to inject hot carriers of the second conductivity type in the carrier trap layer near the diffusion region applied with the high level voltage; in a data read mode, to flow carriers of the second conductivity type in the channel region along a direction opposite to a direction in the data write mode; and in a data erase mode, to apply a low level voltage or an opposite polarity voltage to the gate electrode, a low level voltage to one of the first and second diffusion regions, and a high level voltage to the other of the first and second diffusion regions to inject hot carriers of the first conductivity type generated by an interband tunneling effect near the other of the first and second diffusion regions, into the carrier trap layer near the diffusion region applied with the high level voltage, and neutralize charge carriers of the second conductive type.

According to another aspect of the present invention, there is provided a control method for a nonvolatile semiconductor memory having a number of nonvolatile semiconductor memory cells formed on a surface of a semiconductor substrate each having a gate insulating film including a carrier trap layer, a gate electrode formed on the gate insulating film, and first and second diffusion regions symmetrically formed in the semiconductor substrate on both sides of the gate electrode, the control method comprising the steps of: selectively writing data at a memory position near the first or second diffusion region through injection of hot carriers of a first conductivity type, by applying a first high level voltage to the first or second diffusion region, a second voltage lower than the first voltage to the second or first diffusion region, and a third voltage higher than the second voltage to the gate electrode; and selectively erasing the data at the memory position near the first or second diffusion region through injection of hot carriers of a second conductivity type opposite to the first conductivity type generated by an interband tunneling effect, by applying a first high level voltage to the first or second diffusion region, a second voltage lower than the first voltage to the second or first diffusion region, and a third voltage lower than the first voltage or of an opposite polarity to the gate electrode.

As above, a nonvolatile semiconductor memory is provided which is easy to be manufactured and has high reliability.

A semiconductor memory is provided which can store two bits per one cell, and be manufactured with ease and has high reliability.

A novel control method for such a nonvolatile semiconductor memory is also provided.

DESCRIPTION OF THE PREFERRED EMBODIMENTS

Prior to describing the embodiments, a nonvolatile semiconductor memory capable of storing two bits per one cell proposed by U.S. Pat. No. 5,768,192 will be described.

Figure 5A:
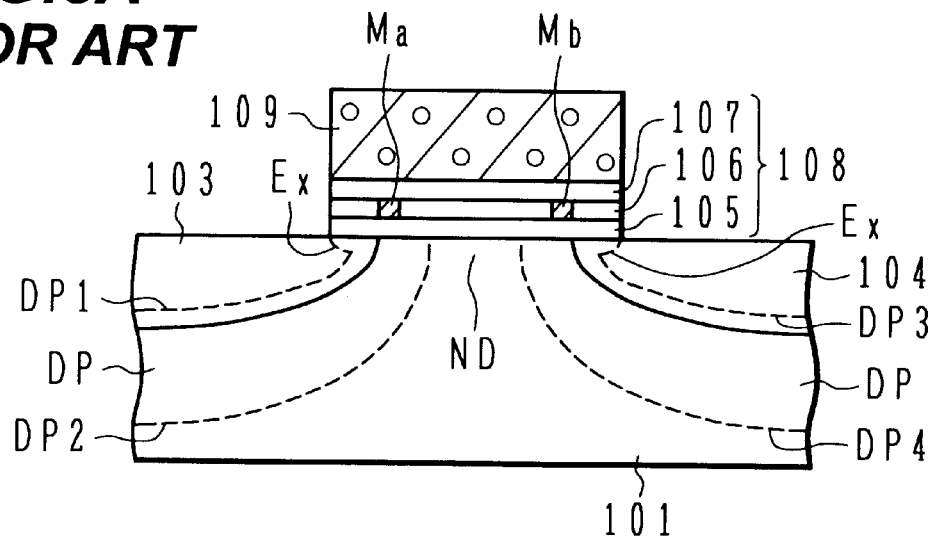
FIGS. 5A, 5B and 5C are a schematic cross sectional view of a nonvolatile memory capable of storing two bits per one cell according to conventional techniques, and a potential diagram and a circuit diagram illustrating its erase operation analyzed by the present inventor.

FIG. 5A is a schematic cross sectional view of a nonvolatile semiconductor memory capable of storing two bits per one cell. A p-type semiconductor substrate 101 has on its surface a gate insulating film 108 made of a lamination of a silicon oxide film 105, a silicon nitride film 106 and a silicon oxide film 107. A gate electrode 109 is formed on this gate insulating film 108. In a surface layer of the semiconductor substrate, n-type diffusion regions 103 and 104 are formed on both sides of the gate electrode 109 to constitute an insulated gate type field effect transistor structure.

The silicon nitride film 106 sandwiched between the silicon oxide films 105 and 107 of the gate insulating film 108 has a function of trapping injected charges. The silicon nitride film has a number of carrier trap levels so that charges once injected are trapped at respective positions.

Hot electrons injected by grounding the n-type region 103 and applying positive potentials to the n-type region 104 and gate electrode 109 are trapped in the silicon nitride film 106 at a memory position Mb near the n-type region 104. Hot electrons injected by grounding the n-type region 104 and applying positive potentials to the n-type region 103 and gate electrode 109 are trapped in the silicon nitride film 106 at a memory position Ma near the n-type region 103.

By reversing the write current direction as in the above manner, charges can be selectively stored either at the position Ma or Mb under the same gate electrode 109.

In reading data, as electron current is flowed from the n-type region 103 toward the n-type region 104, the charges at the memory position Ma greatly influence the formation of the channel current, but the charges at the memory position Mb influence less the formation of the channel current. As the direction of the channel current is reversed, the influence of the charges at the memory position Mb becomes great whereas the influence of the charges at the memory position Ma becomes less. The influences of the stored charges at the two memory positions Ma and Mb can therefore be read independently.

If a reverse vias voltage is applied between the gate electrode and n-type source/drain region, current flows between the gate electrode and n-type source/drain region. It is known that as this current, there are Fowler-Nordheim (FN) tunneling current and hot carrier injection current by avalanche breakdown.

FIG. 5A shows also the shapes of depletion layers formed when the reverse vias voltage is applied. Broken lines DP1 and DP2 on both sides of the p-n junction of the n-type region 103 show approximately the boundaries of the depletion layer. Similarly, broken lines DP3 and DP4 on both sides of the p-n junction of the n-type region 104 show approximately the boundaries of the depletion layer.

Under the opposite end portions of the gate electrode 109, end regions Ex depleted by a voltage applied to the gate electrode are also shown. An avalanche breakdown is likely to occur at this end region Ex of the depletion layer.

If the silicon oxide film 105 is thick, for example, 20 nm or thicker, an FN tunneling current is hard to flow unless the voltage between the gate electrode 109 and n-type region 103 or 104 becomes high. Therefore, the potential difference between the n-type region 103 or 104 and channel region becomes large earlier than between the n-type region 103 or 104 and gate electrode 109 and an avalanche breakdown occurs at the end portion of the n-type region 103 or 104.

Hot holes generated by the avalanche breakdown are accelerated by the electric field in the depletion layer. When the hot holes obtain a sufficiently high energy, they are injected toward the gate electrode 109 maintained at the low potential and trapped in the intermediate silicon nitride film 106. Since electrons are trapped beforehand in the silicon nitride film 106, electrons and holes are recombined to erase the stored data.

Figure 5B:
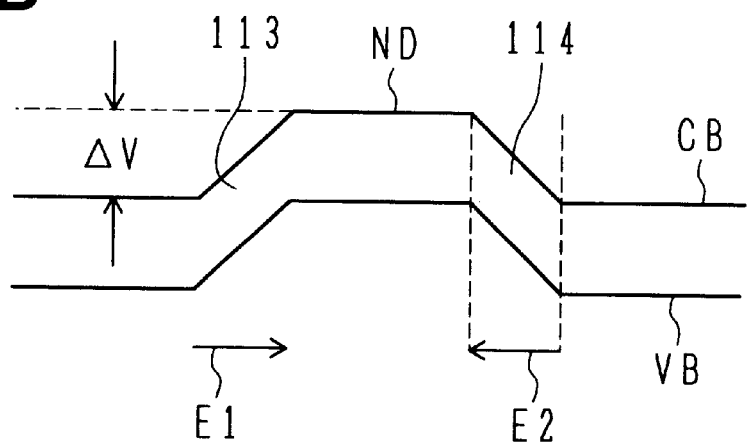

FIG. 5B is a graph showing a potential distribution along a virtual line extending from the n-type region 103 to n-type region 104 when a reverse bias voltage is applied. In FIG. 5B, VB represents the energy level of a valence band in the semiconductor and CB represents that of a conduction band. There is a potential difference $\Delta V$ between the channel region ND not depleted and the opposite n-type regions 103 and 104, the potential difference being formed by the depletion layers 113 and 114 therebetween. The depletion layers 113 and 114 generate electric fields E1 and E2. Holes generated near at the n-type region 103, 104 are accelerated by the electric field E1, E2 to enter a high energy state.

Figure 5C:
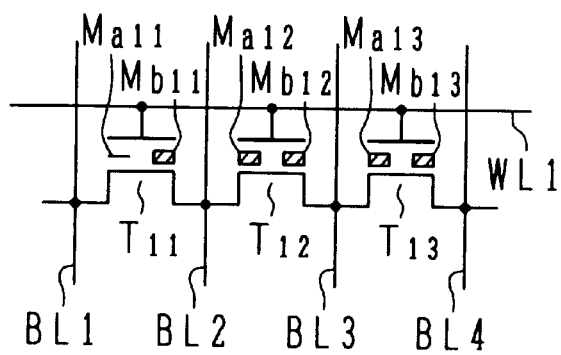

FIG. 5C is a circuit diagram schematically showing the structure of a nonvolatile semiconductor memory. A word line WL1 is connected to the gate electrodes of a plurality of memory transistors $T_{11}$, $T_{12}$, . . . . The n-type regions of the respective memory transistors $T_{11}$, $T_{12}$, . . . are connected to bit lines BL1, BL2, BL3 . . . . As shown in FIG. 5C, the n-type region 104 of one of adjacent two memory transistors $T_{11}$ and $T_{12}$ and the n-type region 103 of the other are generally merged and connected to one common bit line BL2 in order to reduce the memory cell size. Other transistors are also connected in a similar manner. The outermost n-type regions of the transistors at opposite ends of each row are each connected singularly to the corresponding bit line.

Memory positions Ma and Mb are represented by $Ma_{11}$, $Mb_{11}$, $Ma_{12}$ and $Mb_{12}$ having suffixes corresponding to those of their transistors $T_{11}$ and $T_{12}$.

In deleting data at the memory position $Mb_{12}$, a low level voltage is applied to the word line WL1 and a high level voltage is applied to the bit line BL3. In this case, the memory positions $Mb_{12}$ and $Ma_{13}$ take the same bias conditions so that data at the memory position $Ma_{13}$ is also erased. In order to recover the data at the memory position $Ma_{13}$, an additional write operation becomes necessary. The erase process becomes complicated.

In order to increase the memory capacity of a semiconductor memory, it is necessary to reduce the size of a memory cell.

Figure 6A:
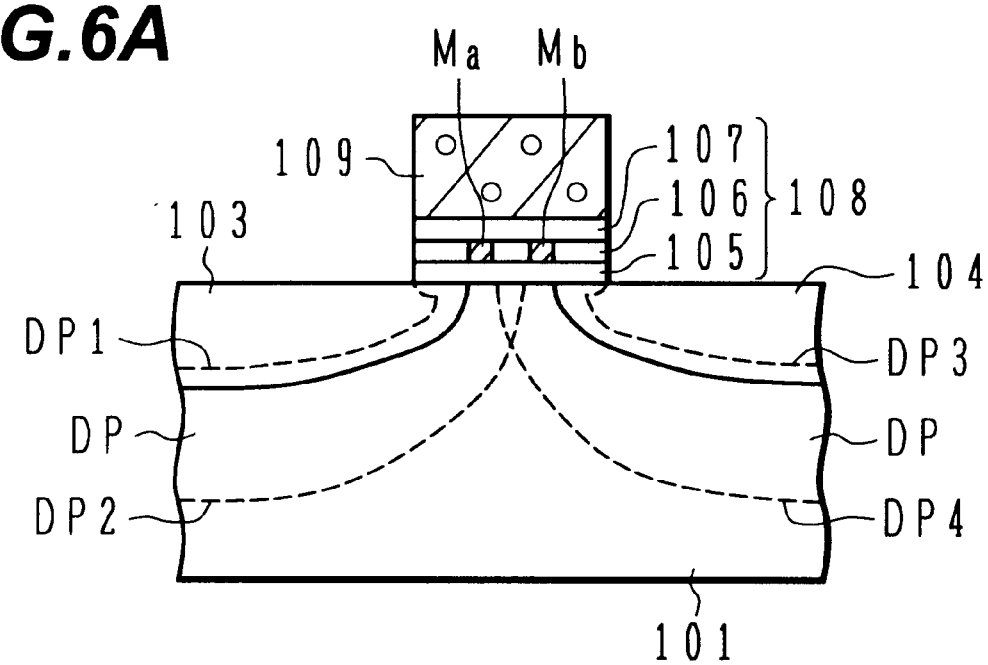
FIGS. 6A and 6B are a schematic cross sectional view and a potential diagram illustrating a problem associated with the nonvolatile semiconductor memory shown in FIG. 5A when this memory is made to have a short channel.
Figure 6B:
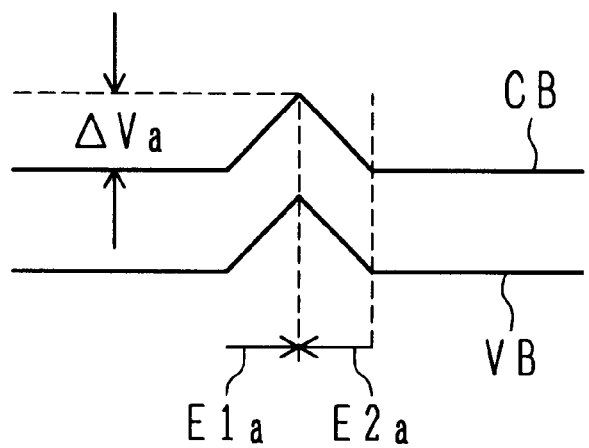

FIGS. 6A and 6B are a schematic cross sectional view and a potential diagram illustrating a problem associated with a memory cell with a short channel. As shown in FIG. 6A, the lengths in a current flow direction of a gate electrode 109 and a gate insulating film 108 are shortened. In a data erase operation by applying a reverse bias voltage between the gate electrode 109 and n-type regions 103 and 104, the reverse bias voltage generates depletion layers DP. DP1 to DP4 represent the boundaries of the depletion layers.

Because of a short channel, the boundaries DP2 and DP4 of the depletion layers overlap under the gate electrode.

FIG. 6B is a schematic diagram showing the potential distribution in the memory cell shown in FIG. 6A. Since the depletion layers overlap under the gate electrode, a potential difference between the conduction band CB and valance band VB lowers to ΔVa. Since the potential difference in the depletion layers lowers, the intensities of electric fields $E1a$ and $E2a$ generated also lower. As a result, even if holes are generated by an avalanche breakdown at the end portions of the n-type regions 103 and 104, it is difficult to neutralize electrons in the silicon nitride film 106.

A nonvolatile semiconductor memory capable of solving such a problem will be described.

Figure 1A:
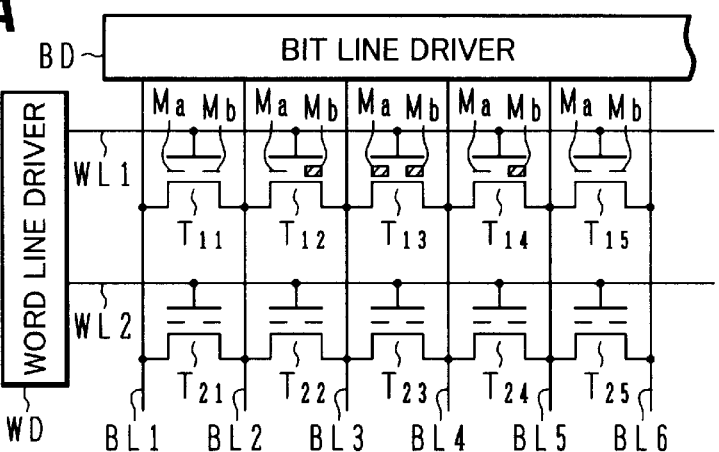
FIGS. 1A to 1G are a circuit diagram and schematic cross sectional views illustrating a nonvolatile semiconductor memory and its operation according to an embodiment of the invention.

FIG. 1A is a schematic circuit diagram of a nonvolatile semiconductor memory. A plurality of word lines WL and bit lines BL crossing each other are disposed on a semiconductor substrate. These bit lines BL are connected to a bit line driver BD formed on the same substrate to be selectively driven by a drive voltage. The word lines WL are connected to a word line driver WD formed on the same substrate to be selectively driven by a scan voltage.

A memory transistor T is connected at each cross point between the word line WL and bit line BL. Between adjacent two bit lines, e.g., bit lines BL1 and BL2, two n-type regions of the memory transistor $T_{11}$ are connected. Each memory transistor has two memory positions Ma and Mb. A transistor connected between the i-th bit line and (i+1)-th bit line is represented by $T_{ij}$, the gate electrode of which is connected to the j-th word line $WL_j$.

Figure 1B:
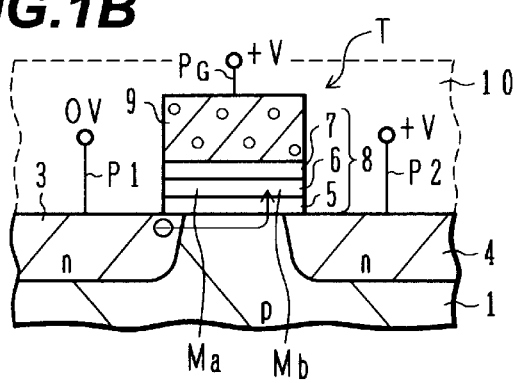

FIG. 1B is a schematic cross sectional view showing the structure of one memory transistor T and illustrating a write operation for the memory transistor T. A p-type semiconductor substrate 1 has on its surface a gate insulating film 8 made of a lamination of a silicon oxide film 5, a silicon nitride film 6 and a silicon oxide film 7. A gate electrode 9 of polysilicon is formed on the gate insulating film 8. The silicon oxide film 7 may be omitted. Other insulating films having a carrier trap function may also be used as the gate insulating film.

For example, as the silicon oxide film 5, a silicon oxide film having a thickness of 10 nm formed by thermal oxidation is used. On the silicon oxide film 5, a silicon nitride film is grown by CVD to a thickness of, for example, 15 nm, and the surface of the silicon nitride film is oxidized at a high temperature to form a silicon oxide film having a thickness of about 10 nm. The thickness of the left silicon nitride film 6 is thinned by an amount corresponding to the growth amount of the silicon oxide film 7.

The gate electrode 9 is formed, for example, by growing a polysilicon layer containing phosphorous of about 2 to $6 \times 10^{20}/cm^3$ to a thickness of about 300 nm by CVD and by pattering the polysilicon layer by known micro fine patterning processes to have a gate length of about 0.2 to 0.5 μm.

After the insulated gate electrode is formed, arsenic ions are implanted into the p-type semiconductor substrate 1 by using the insulated gate electrode as a mask, under the conditions of an acceleration energy of 50 to 100 keV and a dose of about $5 \times 10^{15}$ to $5 \times 10^{16} cm^{-2}$, to thereby form n-type regions 3 and 4. After this ion implantation, the substrate is annealed at 850° C. to 950° C. for about 30 to 60 minutes by a known thermal diffusion method to activate implanted arsenic ions and diffuse them also to the regions under the gate electrode 9.

Thereafter, an interlayer insulating film 10 of silicon oxide or the like is formed. Contact holes are formed through the interlayer insulating film 10, and metal lead wires P1, P2, $P_G$ and the like are formed to complete a semiconductor memory.

In writing data, a low level potential, e.g., a ground potential, is applied to the lead wire P1 connected to the n-type region 3, a high level positive potential, e.g., 12 V, is applied to the lead wire $P_G$ connected to the gate electrode 9, and a positive potential lower than 12 V, e.g., 6 V is applied to the lead wire P2 connected to the n-type region 4. Since the positive potential is applied to the gate electrode 9, the surface of the p-type semiconductor substrate 1 is inverted to n-type so that electrons flow from the n-type region 3 toward the n-type region 4 maintained at the positive potential. These electrons are accelerated in the depletion layer near at the n-type region 4 and become hot electrons which pass through the silicon oxide film 5 and are injected into the silicon nitride film 6 at a memory position Mb. In this manner, data is written in the silicon nitride film 6 at the memory position Mb near the n-type region 4.

Figure 1C:
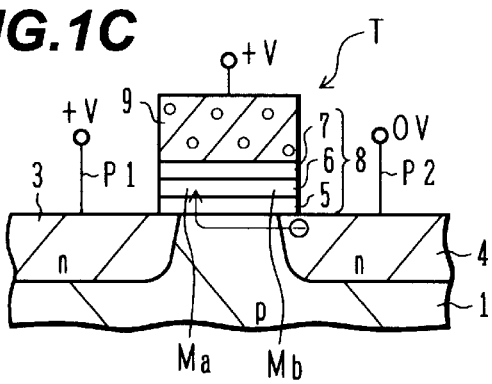

As shown in FIG. 1C, as the voltages applied to the n-type regions 3 and 4 are exchanged, electrons flowed from the n-type region 4 are injected into the silicon nitride film 6 at the memory position Ma near the n-type region 3 so that the data is stored at the memory position Ma. In this manner, data can be written in the silicon nitride film 6 selectively at two memory positions Ma and Mb.

Figure 1D:
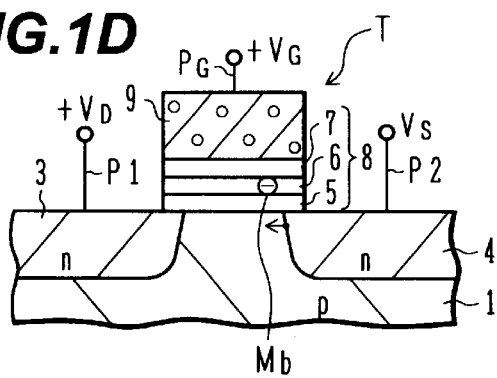

FIG. 1D illustrates the operation of reading data written near the n-type region 4. A source voltage $V_s$ (ground potential) is applied to the n-type region 4 which serves as a source, a drain voltage $V_D$, e.g., 2 V, is applied to the n-type region 3 which serves as a drain, and an on/voltage $+V_G$, e.g., 3 V, is applied to the gate electrode 9. Since electrons are stored in the silicon nitride film 6 at the memory position Mb near the n-type region 4, even if the gate on-voltage +$V_G$(3 V) is applied, the channel region under the stored charge will not be inverted and channel current will not flow.

If charges are not stored at the memory position Mb, the channel region is inverted and drain current flows. The stored data can be read in this manner. The operation of reading charges written near the n-type region 3 can be performed in a similar manner by using the n-type region 3 as the source and the n-type region 4 as the drain.

Figure 1E:
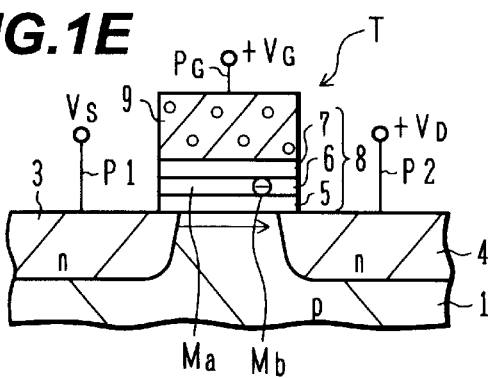

FIG. 1E is a schematic cross sectional view illustrating that data written at two positions above the same channel can be read independently. In FIG. 1E, data in the silicon nitride film 6 at the memory position Ma near the n-type region 3 is read. It is assumed that electrons are not stored at the memory position Ma near the n-type region 3 and electrons are stored at the memory position Mb near the n-type region 4.

A source voltage $V_s$ of 0 V is applied to the n-type region 3, a drain voltage $V_D$ of 2 V is applied to the n-type region 4, and an on-voltage $V_G$ of 3 V larger than the threshold voltage is applied to the gate electrode 9. Since electrons are not stored at the memory position Ma near the n-type region 3, the channel is induced and electrons flow from the n-type region 3 toward the n-type region 4.

Although electrons are stored at the memory position Mb near the n-type region 4, the depletion layer develops to establish an electric field so that electron transportation is not hindered substantially. As a result, a read current indicated by an arrow can be controlled only by a presence/absence of charges at the memory position Ma near the n-type region 3.

Figure 1F:
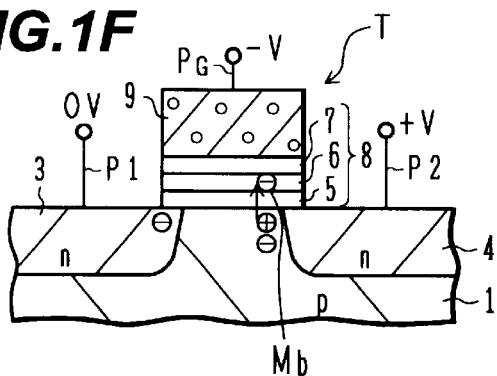

FIG. 1F illustrates an erase operation. It is assumed that electrons stored at the memory position Mb near the n-type region 4 are to be erased. A low level voltage of 0 V is applied to the n-type region 3, a high level position voltage, e.g., +6 V, is applied to the n-type region 4, and a low level voltage or an opposite polarity voltage, e.g., −5 V, is applied to the gate electrode 9.

Figure 2A:
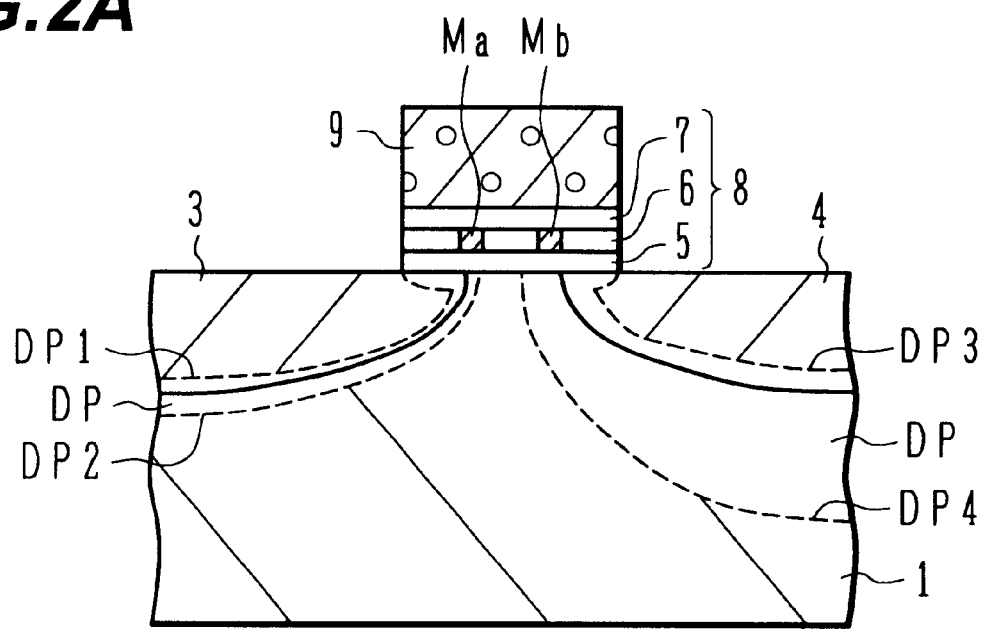
FIGS. 2A and 2B are a schematic cross sectional view and a potential diagram illustrating the operation of the memory cell shown in FIGS. 1A to 1G.

FIG. 2A is a schematic diagram showing the shapes of depletion layers formed in the semiconductor substrate during the erase operation. Since the n-type region 3 is maintained at 0 V, the width of the depletion layer DP formed near its p-n junction is as narrow as (DP1–DP2). Since a relatively large positive voltage of +6 V is applied to the n-type region 4, the width of the depletion layer DP formed near its p-n junction is as wide as (DP3–DP4).

If the same voltage of +6 V is applied also to the n-type region 3, the depletion layer DP (DP1–DP2) is widened and the boundaries DP2 and DP4 of the depletion layers contact. However, since the bias voltage of the n-type region 3 is made small and the width of the depletion layer DP (DP1–DP2) is made narrow, the depletion layers will not overlap.

Figure 2B:
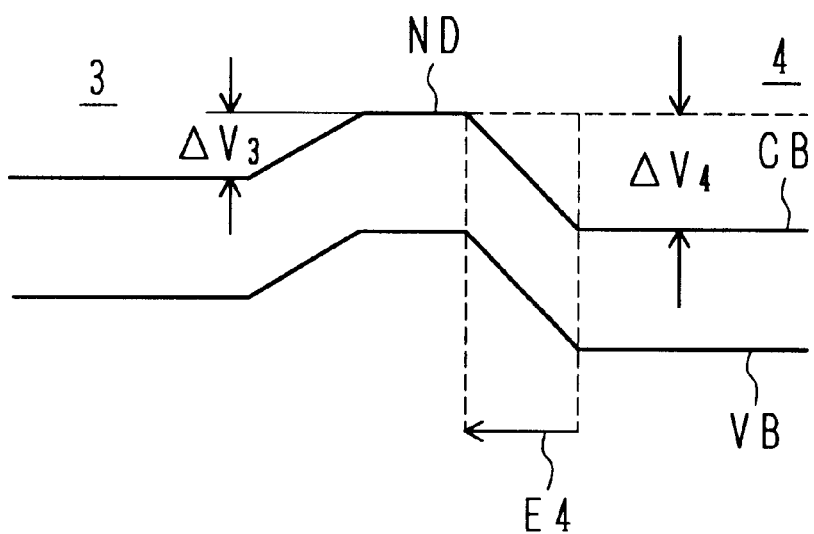

FIG. 2B is a schematic diagram showing a potential distribution along a virtual line extending from the n-type region 3 to n-type region 4. Relative to the region ND of the channel region not depleted, the n-type region 3 has a potential difference of $\Delta V3$ whereas the n-type region 4 has a potential difference of $\Delta V4$. Since the potential difference $\Delta V3$ is small, the depletion layer at the n-type region 3 is narrow and the intensity of an electric field is small. On the other hand, the depletion layer at the n-type region 4 develops sufficiently and the intensity of the electric field E4 formed by the potential difference $\Delta V4$ is sufficiently large.

Accordingly, holes generated by an avalanche breakdown by the interband tunneling effect can be accelerated sufficiently to become hot holes which are injected into the silicon nitride at the memory position Mb and neutralize electrons stored at the memory position Mb.

Referring to the circuit diagram shown in FIG. 1A, when electrons at the memory position Mb of the transistor $T_{13}$ are to be erased, voltages described above are applied to the word line WL1 and bit line BL4. There is therefore a possibility that holes are injected into the silicon nitride film at the memory position Ma of the adjacent memory transistor $T_{14}$.

Figure 1G:
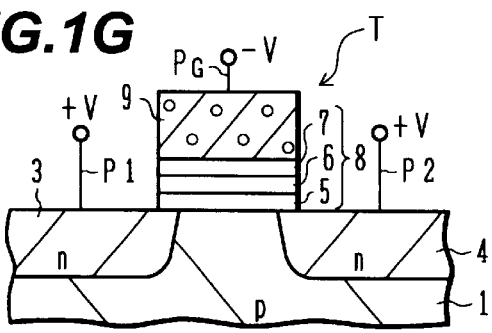

FIG. 1G illustrates a method of preventing holes from being injected in the transistor $T_{14}$. The same voltage is applied to both the n-type regions 3 and 4 of the transistor whose data is not to be erased. A voltage of about +6 V is applied to the n-type region 3 of the transistor $T_{14}$, and a high level positive voltage of +6 V is also applied to the n-type region 4. By applying these voltages, the depletion layers of the n-type regions 3 and 4 overlap as shown in FIG. 6B and an electric field is constrained. As a result, holes cannot obtain a sufficiently high energy and holes can be prevented from being injected at the memory position.

Instead of applying a high level voltage, e.g., +6 V, to the n-type region 4, the n-type region 4 may be set to a floating state. In this case, the depletion layer of the n-type region 3 applied with a high level voltage reaches the n-type region 4. Electrons in the n-type region 4 therefore flow toward the n-type region 3 applied with the high level voltage so that the potential at the n-type region 4 is changed to the potential approximately equal to that of the n-type region 3. The erase operation will not be executed similar to the case wherein the high level voltage is applied to the n-type region 3.

In other words, when a low level or opposite polarity voltage is applied to the gate of a memory transistor and a high level voltage is applied to one of the diffusion regions, and if data at the memory position near the one diffusion region is to be erased, a low level voltage is applied to the other diffusion region. Whereas if the data is not to be erased, a high level voltage is applied to the other diffusion region or this region is set to a floating state. This bias setting is also applicable to the following embodiment.

There is a case that when the storage state of a nonvolatile semiconductor memory is to be updated, it is desired that the presently stored data is all erased.

Figure 3A:
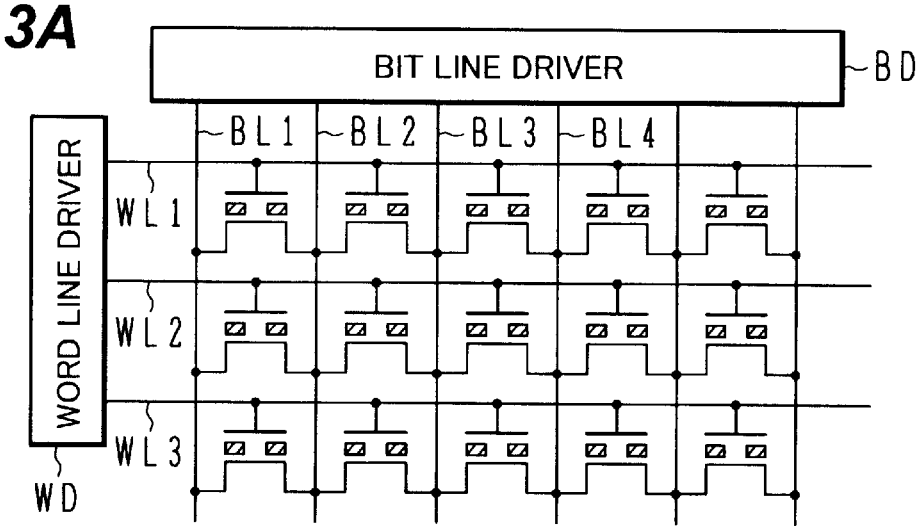
FIGS. 3A, 3B and 3C are circuit diagrams briefly illustrating a block erase operation of the embodiment shown in FIGS. 1A to 1G.
Figure 3B:
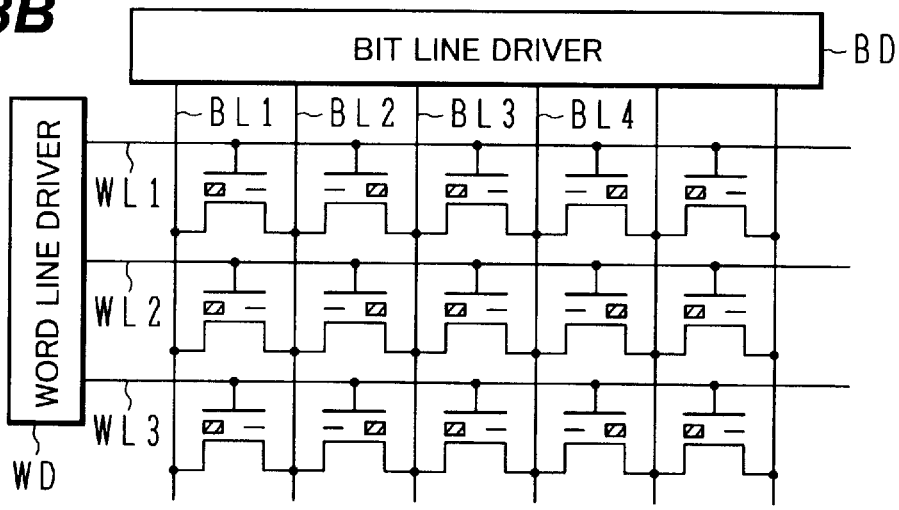
Figure 3C:
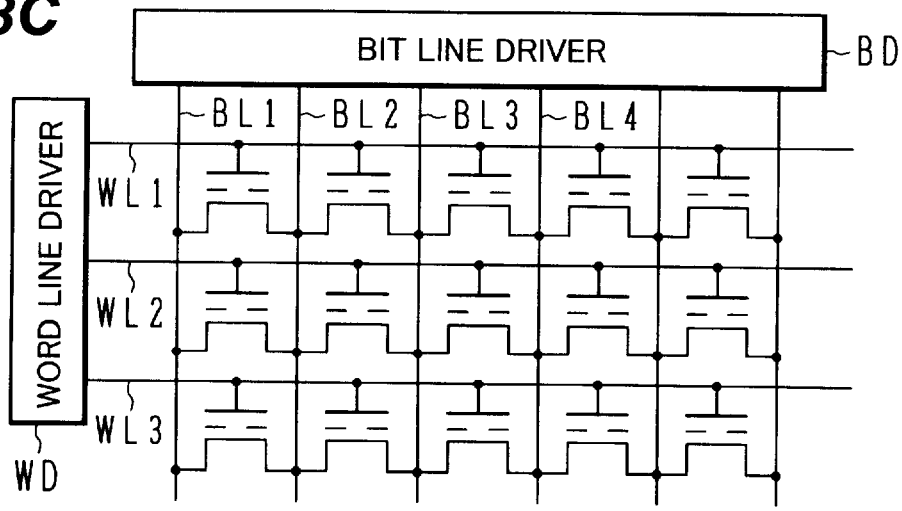

FIGS. 3A, 3B and 3C illustrate how data in all transistors in a block are erased. A number of transistors T are disposed in a matrix form in a block, and the gate electrodes of all rows are connected to corresponding word lines WL1, WL2, WL3, . . .

Adjacent n-type regions of adjacent transistors are connected in common and commonly connected n-type regions of all columns are connected to corresponding bit lines BL1, BL2, BL3 . . . . The word lines WL are connected to a word line driver WD, and the bit lines BL are connected to a bit line driver BD.

In erasing data of all transistors, first electrons are stored at all memory positions.

FIG. 3A shows the state that electrons are stored at all memory positions. Next, a predetermined negative potential, e.g., −5 V, is applied to all the word lines LW1, WL2, WL3, . . . and a predetermined positive potential, e.g., +6 V, is applied to every second bit lines, for example, even-numbered bit lines BL2, BL4, . . . , and a ground potential is applied to odd-numbered bit lines BL1, BL3, . . .

By applying these bias potentials, holes are injected at memory positions near the source/drain regions connected to the bit lines BL2, BL4, . . . applied with the high potential and stored electrons are neutralized.

FIG. 3B shows the state that data at the memory positions near the even-numbered bit lines have been all erased. Next, a predetermined positive potential, e.g., +6 V, is applied to the odd-numbered bit lines BL1, BL3, . . . , and a ground potential is applied to the even-numbered bit lines BL2, BL4, . . . . The word lines WL are applied with a predetermined negative potential, e.g., −5 V. By applying these bias potentials, holes are injected at memory positions near the source/drain regions connected to the odd-numbers bit lines BL1, BL3, . . . and stored electrons are neutralized.

FIG. 3C shows the state that data at the memory positions near the odd-numbered bit lines have been all erased. With the erase operation at two stages described above, data at all the memory positions in the block are erased and initialized.

The write programming voltage and erase programming voltages are selected so that electrons and holes are injected at the same memory position. However, injected electrons may be moved by thermal stress generated thereafter. Further, an injected position may be moved by a fluctuation of the programming voltage.

Figure 4A:
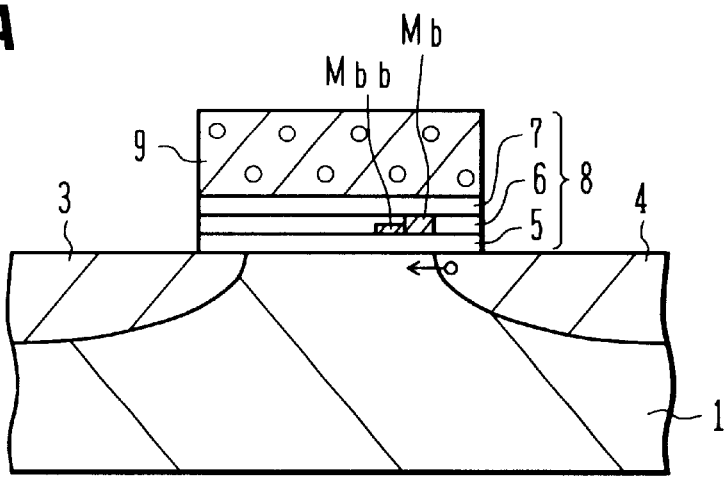
FIGS. 4A, 4B and 4C are schematic cross sectional views and a potential diagram illustrating an erase operation according to another embodiment of the invention.

FIG. 4A shows the state that electrons are stored also at a position different from a target memory position. Mb indicates the target memory position and Mbb near Mb indicates the position of electrons moved by some causes. If stored electrons distribute to a position different from the target memory position, the electrons at the changed memory position Mbb cannot be erased by a usual erase operation.

Figure 4B:
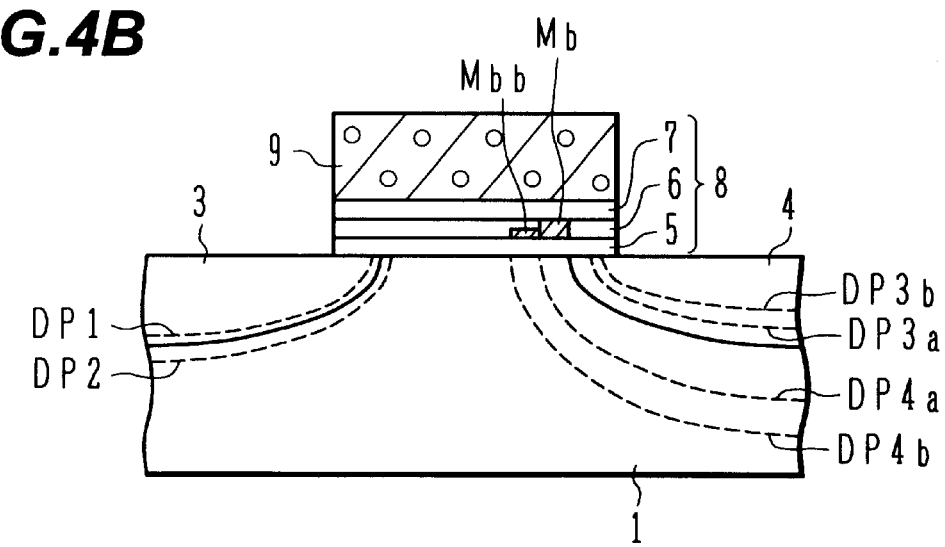

In the state shown in FIG. 4B, a ground level is applied to the n-type region 3, a predetermined negative voltage is applied to the gate electrode 9, and a positive voltage applied to the n-type region 4 is changed. When a predetermined erase programming voltage is applied to the n-type region 4, a depletion layer (DP3a–DP4a) is formed around the p-n junction of the n-type region 4. At this time, holes are injected at the predetermined memory position Mb to neutralize electrons at this memory position Mb. However, electrons at the changed memory position Mbb cannot be neutralized by this erase operation.

The positive voltage applied to the n-type region 4 is increased. This increased positive voltage applied to the n-type region 4 broadens the depletion layer to a depletion layer (DP3b–DP4b). As the depletion layer broadens, the hole injected position moves toward the channel central area. Holes are therefore injected at the changed memory position Mbb and neutralize electrons at the memory position Mbb.

Figure 4C:
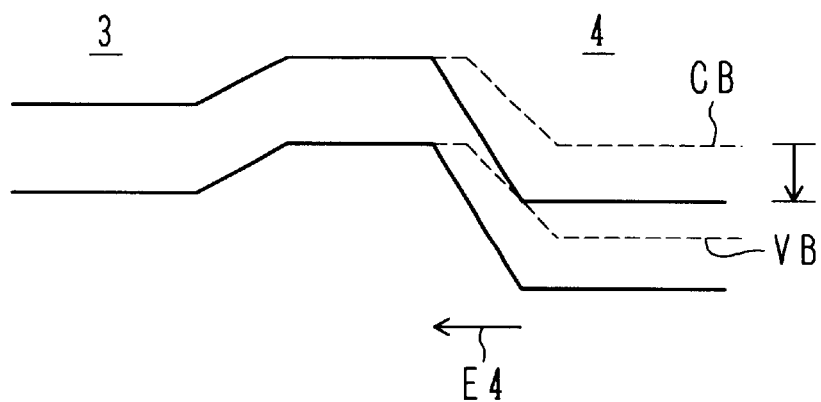

FIG. 4C is a schematic diagram showing the potential distribution of the semiconductor substrate shown in FIG. 4B. A conduction band potential CB and a valence band potential VB when the predetermined erase programming voltage is applied are indicated by broken lines, and the potentials when the increased positive potential is applied to the n-type region are indicated by solid lines. As the applied voltage is increased, the depletion layer near the n-type region 4 broadens and the intensity of the generated electric field E4 increases.

If stored charges distribute to a position different from a target position, the electric characteristics of the transistor after the erase operation become different from the designed characteristics, even if a usual erase operation is executed. When such abnormality is detected, a modified erase operation described above is executed to erase charges injected at the changed memory position. If the position of injected charges moves toward the n-type region 3 or 4 (to the outer side), the formation of the channel for the read operation is not influenced and no problem occurs.

The present invention has been described in connection with the preferred embodiments. The invention is not limited only to the above embodiments. It will be apparent to those skilled in the art that various modifications, improvements, combinations, and the like can be made.

What I claim are:

1. A nonvolatile semiconductor memory comprising:

a semiconductor substrate of a first conductivity type;

first and second diffusion regions of a second conductivity type formed in a surface layer of said semiconductor substrate to define a channel region therebetween;

a gate insulating film formed on the channel region, said gate insulating film including a carrier trap layer capable of trapping charge carriers;

a gate electrode formed on said gate insulating film; and a control circuit for controlling: in a data write mode, to apply a high level voltage to said gate electrode, a low level voltage to one of said first and second diffusion regions, and a high level voltage to the other of said first and second diffusion regions to inject hot charge carriers of the second conductivity type in the carrier trap layer near the diffusion region applied with the high level voltage; in a data read mode, to flow carriers of the second conductivity type in the channel region along a direction opposite to a direction in the data write mode; and in a data erase mode, to apply a low level voltage or an opposite polarity voltage to said gate electrode, a low level voltage to the one of said first and second diffusion regions, and a high level voltage to the other of said first and second diffusion regions to inject hot charge carriers of the first conductivity type generated by an interband tunneling effect near the other of the first and second diffusion regions, into the carrier trap layer near the diffusion region applied with the high level voltage, and neutralize charge carriers of the second conductive type.

2. A nonvolatile semiconductor memory comprising:

a semiconductor substrate of a first conductivity type;

a number of nonvolatile semiconductor memory cells formed in a surface layer of said semiconductor substrate, said nonvolatile semiconductor memory cells being disposed in a matrix form of m rows and n columns and serially connected along a row direction, each memory cell including first and second diffusion regions of a second conductivity type formed in the surface layer of said semiconductor substrate to define a channel region therebetween, a gate insulating film formed on the channel region and including a carrier trap layer capable of trapping charge carriers, and a gate electrode formed on the gate insulating film;

m word lines for connecting the gate electrodes of nonvolatile memory cells of a same row;

(n+1) bit lines for connecting first or second diffusion regions of nonvolatile semiconductor memory cells of a same column and, if there is an adjacent column to said first or second diffusion regions of said same column, for connecting second or first diffusion regions of nonvolatile semiconductor memory cells of the adjacent column; and a control circuit for controlling: in writing data at a memory position of an i-th row, j-th column nonvolatile semiconductor memory cell only on a (j+1)-th bit line side, to apply a high level voltage to an i-th word line, a low level voltage to a j-th bit line, and a high level voltage to the (j+1)-th bit line to inject charge carriers of the second conductivity type in the carrier trap layer near the diffusion region connected to the (j+1)-th bit line of the semiconductor memory cell, and in erasing the written data, to apply a low level voltage or an opposite polarity voltage to the i-th word line, a low level voltage to the i-th bit line, and a high level voltage to the (j+1)-th bit line to inject carriers of the first conductivity type generated by an interband tunneling effect, into the carrier trap layer near the diffusion region connected to the (j+1)-th bit line of the semiconductor memory cell, and neutralize charge carriers of the second conductive type.

3. A control method for a nonvolatile semiconductor memory having a number of nonvolatile semiconductor memory cells formed on a surface of a semiconductor substrate each having a gate insulating film including a carrier trap layer, a gate electrode formed on the gate insulating film, and first and second diffusion regions formed in the semiconductor substrate on both sides of the gate electrode, the control method comprising the steps of:

selectively writing data at a memory position near the first or second diffusion region through injection of hot charge carriers of a first conductivity type, by applying a first high level voltage to the first or second diffusion region, a second voltage lower than the first voltage to the second or first diffusion region, and a third voltage higher than the second voltage to the gate electrode; and selectively erasing the data at the memory position near the first or second diffusion region through injection of hot charge carriers of a second conductivity type opposite to the first conductivity type generated by an interband tunneling effect, by applying a first high level voltage to the first or second diffusion region, a second voltage lower than the first voltage to the second or first diffusion region, and a third voltage lower than the first voltage or of an opposite polarity to the gate electrode.

4. A control method for a nonvolatile semiconductor memory having a number of nonvolatile semiconductor memory cells formed on a semiconductor substrate of a first conductivity type and disposed in m rows and n columns, the memory cells in a row direction being connected serially, each memory cell including a gate insulating film formed on a surface of the semiconductor substrate and including a carrier trap layer capable of trapping charge carriers, a gate electrode formed on the gate insulating film, and first and second diffusion regions of a second conductivity type formed in the semiconductor substrate on both sides of the gate electrode, the nonvolatile memory having m word lines for connecting the gate electrodes of nonvolatile memory cells of a same row, and (n+1) bit lines for connecting first or second diffusion regions of nonvolatile semiconductor memory cells of a same column and, if there is an adjacent column to said first or second diffusion regions of said same column, for connecting second or first diffusion regions of nonvolatile semiconductor memory cells of the adjacent column, the control method comprising:

a data write step capable of writing two bits per one semiconductor memory cell, said data write step writing data by applying a low level voltage to one of the first and second diffusion regions of each semiconductor memory cell, a high level voltage to the other of the first and second diffusion regions, and a high level voltage to the gate electrode to trap charge carriers of the second conductivity in the carrier trap layer near the other of the first and second diffusion regions; and a data erase step capable of selectively controlling erase/non-erase on a bit unit basis, said data erase step selectively injecting carriers of the first conductivity type in the carrier trap layer by setting a potential of one of the first and second diffusion regions on an erase side to a high level, a potential of the other of the first and second diffusion regions to a low level, or to a high level or a floating level, and a potential of the gate electrode to a low level or an opposite polarity level.

5. A control method for a nonvolatile semiconductor memory according to claim 4, wherein voltages used by said erase step and a size and impurity concentration of each semiconductor memory cell are so selected that depletion layers around the first and second diffusion regions are not overlapped at a semiconductor memory cell to be erased, and are overlapped at a semiconductor memory cell not to be erased.

6. A control method for a nonvolatile semiconductor memory according to claim 4, further composing the step of erasing all the data of the semiconductor memory cells including the sub-steps of:

writing every bit of each of said memory cells;
erasing every bit connected to even bit lines; and
erasing every bit connected to odd bit lines.

7. A control method for a nonvolatile semiconductor memory having a number of nonvolatile semiconductor memory cells formed on a semiconductor substrate of a first conductivity type and disposed in m rows and n columns, the memory cells in a row direction being connected serially, each memory cell including a gate insulating film formed on a surface of the semiconductor substrate and including a carrier trap layer capable of trapping charge carriers, a gate electrode formed on the gate insulating film, and first and second diffusion regions of a second conductivity type formed in the semiconductor substrate on both sides of the gate electrode, and the nonvolatile memory having m word lines for connecting the gate electrodes of nonvolatile memory cells of a same row, and (n+1) bit lines for connecting first or second diffusion regions of nonvolatile semiconductor memory cells of a same column and, if there is an adjacent column to said first or second diffusion regions of said same column, for connecting second or first diffusion regions of nonvolatile semiconductor memory cells of the adjacent column, the control method comprising:

an erase step of, when carriers of the second conductivity type written in an i-th row, j-th column nonvolatile semiconductor memory cell near the diffusion region connected to a (j+1)-th bit line are to be erased, applying a low level voltage or an opposite polarity voltage to an i-th word line, applying a low level voltage to first to (j−1)-th bit lines or setting the first to (j−1)-th bit lines to a floating state, applying a low level voltage to a j-th bit line, applying a high level voltage to the (j+1)-th bit line, and applying a high level signal to (j+2)-th and succeeding bit lines or setting the (j+2)-th and succeeding bit lines to a floating state, to inject carriers of the first conductivity type generated by an interband tunneling effect into the semiconductor memory cell near the diffusion region connected to the (j+1)-th bit line.

8. A control method for a nonvolatile semiconductor memory according to claim 7, wherein voltages used by said erase step and a size and impurity concentration of each semiconductor memory cell are so selected that depletion layers around the first and second diffusion regions are not overlapped at a semiconductor memory cell to be erased, and are overlapped at a semiconductor memory cell not to be erased.

9. A control method for a nonvolatile semiconductor memory according to claim 7, further composing the step of erasing all the data of the semiconductor memory cells including the sub-steps of:

writing every bit of each of said memory cells;
erasing every bit connected to even bit lines; and
erasing every bit connected to odd bit lines.

* * * * *